United States Patent [19]
Shiraishi

[11] Patent Number: 5,357,311
[45] Date of Patent: Oct. 18, 1994

[54] PROJECTION TYPE LIGHT EXPOSURE APPARATUS AND LIGHT EXPOSURE METHOD

[75] Inventor: Naomasa Shiraishi, Kawasaki, Japan

[73] Assignee: Nikon Corporation, Tokyo, Japan

[21] Appl. No.: 79,355

[22] Filed: Jun. 21, 1993

Related U.S. Application Data

[63] Continuation of Ser. No. 988,016, Dec. 9, 1992, abandoned, which is a continuation of Ser. No. 835,575, Feb. 14, 1992, abandoned.

[30] Foreign Application Priority Data

Feb. 25, 1991 [JP] Japan ................................ 3-30351
Feb. 28, 1991 [JP] Japan ................................ 3-34512

[51] Int. Cl.$^5$ ............................................. G03B 27/42
[52] U.S. Cl. ........................................ 355/53; 355/71; 355/77
[58] Field of Search ........................... 355/53, 67, 71; 356/152, 394; 250/548

[56] References Cited

U.S. PATENT DOCUMENTS

| | | | |
|---|---|---|---|
| 4,668,089 | 5/1987 | Oshida et al. | 356/152 |
| 4,869,999 | 9/1989 | Fukuda et al. | 430/311 |
| 4,931,830 | 6/1990 | Suwa et al. | 355/71 |
| 4,947,413 | 8/1990 | Jewell et al. | 378/34 |
| 5,111,240 | 5/1992 | Boettiger et al. | 355/53 |
| 5,119,113 | 6/1992 | Prakash et al. | 346/108 |
| 5,144,362 | 9/1992 | Kamon et al. | 355/53 |

*Primary Examiner*—Richard A. Wintercorn
*Attorney, Agent, or Firm*—Shapiro and Shapiro

[57] ABSTRACT

A projection type light exposure apparatus comprises, a mask having a fine pattern and at least one auxiliary pattern spaced from the fine pattern by a predetermined distance along an edge of the fine pattern, a projection optical system for projecting the fine pattern on the mask onto a photosensitive substrate, an illumination optical system for supplying an illumination light to the mask, and the illumination light being irradiated from at least one local area centered at a position eccentric from an optical axis of the illumination optical system in or a vicinity of a Fourier transform plane of the mask in the illumination optical system.

46 Claims, 10 Drawing Sheets

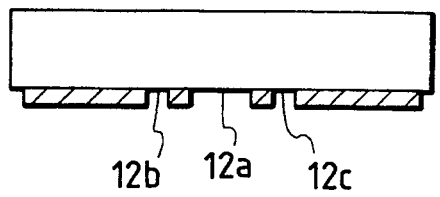
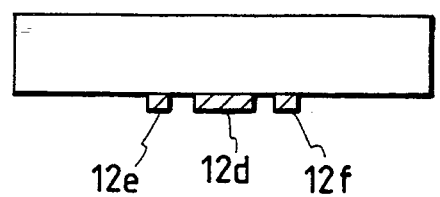
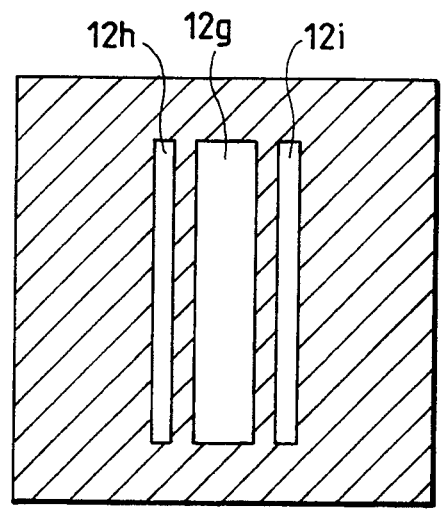
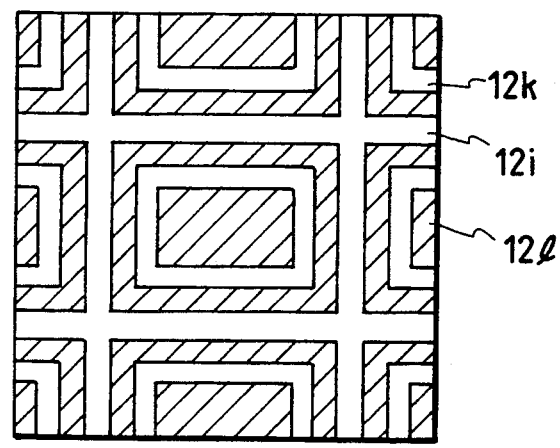

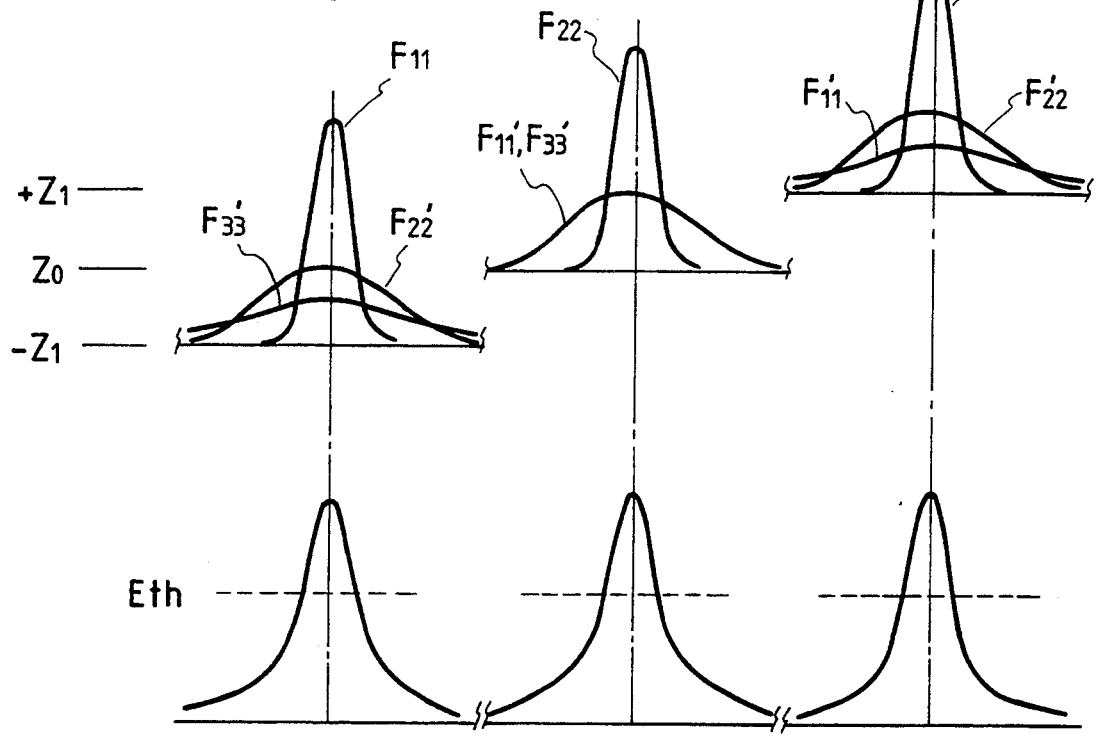
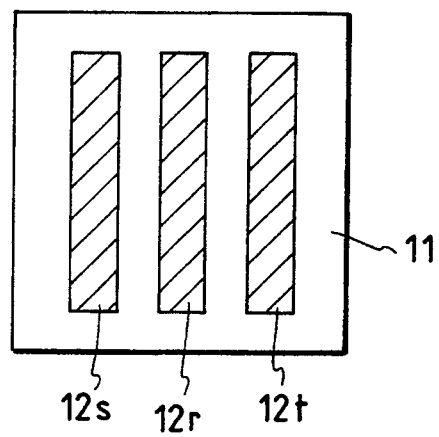

PROJECTION TYPE LIGHT EXPOSURE APPARATUS AND LIGHT EXPOSURE METHOD

This is a continuation of application Ser. No. 988,016 filed Dec. 9, 1992, which is a continuation of application Ser. No. 835,575 filed Feb. 14, 1992, now both abandoned.

BACKGROUND OF THE INVENTION

1. Field of the Invention

The present invention relates to a projection type light exposure apparatus and a light exposure method in a circuit pattern formation technology of a semiconductor device.

2. Related Background Art

In a prior art light exposure method, a mask (reticle) is illuminated by a projection type light exposure apparatus which illuminates the reticle by a light beam having a light intensity distribution which has a circular section around an optical axis of an illumination optical system in a plane of the illumination optical system (a pupil plane of the illumination optical system) which is a Fourier plane of a plane on which a pattern of the reticle is present, or in a vicinity of the pupil plane. An angle of incidence of the illumination light beam to the reticle (that is, an aperture number of the illumination light beam) usually has a ratio of the aperture number of the illumination light beam and the aperture number of the projection optical system facing the reticle, that is, a so-called coherence factor ($\sigma$ value) of $0.3 < \sigma < 0.6$. A manner of illumination of the illumination light beam to the reticle in the light exposure apparatus is illustrated in FIGS. 11A–11C.

FIG. 11A shows the illumination of the illumination light beam to the pattern on the reticle in a prior art light exposure method a circuit pattern 12P to be transferred is drawn on the reticle 11 to be used in the light exposure method, and other area is a light shield area (hatched area). An illumination light L1 is substantially perpendicularly irradiated to the pattern. FIG. 11B shows an amplitude distribution of a light transmitted through the pattern in the prior art light exposure method shown in FIG. 11A. A complex amplitude of the light transmitted through the circuit pattern 12P is substantially uniform within the circuit pattern 12P. This value is represented by +1. Thus, it is assumed that a positive amplitude distribution Ap appears on the wafer. It is a superposition integration of the shape of the circuit pattern 12P and a point image amplitude distribution of the projection optical system to be used. FIG. 11C shows an intensity distribution of a light reaching onto the wafer in the prior art light exposure method shown in FIG. 11A. The intensity distribution is a square of an absolute value of the amplitude distribution Ap and it is represented by Ep. A width of a light intensity which is large enough to sensitize the resist on the wafer is represented by a broken line range $W_1$. Thus, a pattern having the width $W_1$ is transferred onto the wafer.

When the pattern is exposed by the above apparatus, technical improvements such as shortening an exposure wavelength or increasing the aperture number of the projection optical system have been made in order to improve a resolution power of the circuit pattern image.

In a present semiconductor device manufacturing process, it is common to repeat a cycle of film formation, photolithography (transfer of a circuit pattern) and etching approximately twenty times. A film thickness of the formed film is approximately 0.05 $\mu$m to 1 $\mu$m. Thus, as the process proceeds, a step in the order of several $\mu$m is formed on the wafer. When the pattern is further exposed onto the stepped wafer, focuses are different on the upper side and the lower side of the step. Thus, in order to attain a high resolution power over the upper side and the lower side of the step, a projection type light exposure apparatus having a large focal depth is required. To this end, it has been proposed to move or vibrate the wafer along an optical axis of the projection optical system during the exposure to the wafer in order to enhance an apparent focal depth (hereinafter referred to as a progressive focus light exposure method). Namely, the wafer is moved or vibrated along the optical axis of the projection optical system during the exposure so that the light is focused to the upper side and the lower side of the step.

In the prior art light exposure method, however, a fineness (width, pitch) of the circuit pattern on the reticle transferable onto the wafer is limited to approximately $\lambda$/NA ($\mu$m) where $\lambda$ ($\mu$m) is an exposure light wavelength of the light exposure apparatus to be used and NA is an aperture number of the projection optical system facing the reticle. This is because the image is formed by utilizing diffraction and interference phenomena due to the fact that the light is wave motion. Accordingly, the shorter the exposure light wavelength is or the larger the aperture number of the projection optical system is, the higher is the resolution power in principle. However, when the wavelength is shorter than 200 nm, there is no appropriate optical material which can transmit it therethrough and the absorption by air appears. The aperture number NA of the projection optical system is presently already at the technical limit and it is very difficult to attain a larger aperture number NA.

In order to improve an image quality of the pattern under such a circumstance, it has been proposed to provide an auxiliary pattern which is small enough not to be imaged in the vicinity of the circuit pattern. However, the improvement of the image quality in this method is to approach an image of a fine square pattern which would otherwise be imaged into a circle by the projection optical system to a square image, and an essential improvement of the resolution power (imaging of a finer pattern) cannot be expected therefrom.

A phase shift method has recently been proposed to improve the resolution power. In the reticle used in the phase shift method, an auxiliary pattern having a phase shifter to change a phase of a transmitted light from a transmitted light through the circuit pattern by $\pi$ (rad) is provided on the reticle in the vicinity of the circuit pattern. A contrast of the pattern image is enhanced by an interference between the transmitted light from the auxiliary pattern and the transmitted light from the circuit pattern in order to reduce a line width of the circuit pattern which can be imaged. However, the reticle with the phase shifter to be used in the phase shift method is complex in a manufacturing process and hence a defect ratio is high and a manufacturing cost is very high. Further, there is no established method for testing and correcting the defect and the practical use thereof is still difficult.

In the progressive focus light exposure method, an apparently larger focal-depth than that of a conventional light exposure method is attained for an independent pattern (which has a duty factor of more than 3, in other words, which has a pattern pitch of as high as four or more times than a width of a pattern line—hereinafter referred to as a discrete pattern), but it is impossible in principle to improve the resolution power by this method alone.

SUMMARY OF THE INVENTION

In the light of the above, it is an object of the present invention to provide light exposure apparatus and method for attaining a high resolution power by using a reticle formed only by the same light screening area and light transmitting area as those of prior art and providing an auxiliary pattern.

In order to achieve the above object, the projection type light exposure apparatus of the present invention comprises a reticle having an auxiliary pattern of a substantially smaller width than a resolution limit of a projection optical system, or an auxiliary pattern of a width equal to or smaller than that of a circuit pattern to be transferred, provided along an edge of the circuit pattern to be transferred, a projection optical system for projecting the circuit pattern on the reticle onto a wafer, and an illumination optical system for emitting a light beam confined to pass through a local area centered at a point eccentric from an optical axis in a plane (a pupil plane of the illumination optical system) which is a Fourier plane of a pattern plane of the reticle. Thus, by setting the center of the local area through which the light beam passes at a position determined by the line width of the pattern and a directivity (a longitudinal direction of the line pattern), it is possible to irradiate light beams of opposite phases of wavefront to the circuit pattern to be transferred and the auxiliary pattern in the vicinity thereof.

Further, optimum focus points can be set for an upper side and a lower side of a step on the wafer surface by moving or vibrating the wafer along the optical axis of the projection optical system during the projection of the circuit pattern to the wafer.

In accordance with the present invention, the wafer may be illuminated by the light beam such that equi-wave planes of opposite phases reach the circuit pattern to be transferred and the auxiliary pattern in the vicinity thereof so that the amplitude distributions of the light beams transmitted through the patterns are balanced out to produce a pattern image having an intensity distribution which exhibits a sharp peak. Namely, since the improvement of the resolution power by the provision of the auxiliary pattern is enhanced (the enhancement of the effect of the auxiliary pattern is attained by the illumination method of the present invention), the transfer of the pattern which is finer than that of the prior art and same as that attained when the phase shift reticle is used can be attained by using the reticle which has only the light shielding area and the light transmitting area without using the phase shift reticle.

Further, optimum light exposure is attained for various reticles of different pattern line widths or different directivities by varying the center position of the local area through which the illumination light beam passes, in the pupil plane of the illumination optical system.

Further, an apparent focal depth may be expanded by moving or vibrating a substrate relative to an image plane of the projection optical system along the optical axis when the pattern is exposed. When an auxiliary pattern having a substantially equal width to that of the circuit pattern, the transfer of the auxiliary pattern may be prevented by the movement or vibration along the optical axis so that only the circuit pattern is transferred with a high resolution power.

BRIEF DESCRIPTION OF THE DRAWINGS

FIGS. 5A and 5B shows patterns of a reticle used in a light exposure method in accordance with the embodiment of the present invention, FIG. 6 shows a pattern of the reticle used in the light exposure method in accordance with the embodiment of the present invention, FIG. 7 shows a pattern of the reticle used in the light exposure method in accordance with the embodiment of the present invention, FIGS. 13A–13F show intensity distributions of exposure lights and integrated light intensity distributions for areas of a step when exposed stepwise by the light exposure method in accordance with the second embodiment of the present invention, FIG. 14 shows another pattern of the reticle used in the light exposure method in accordance with the second embodiment of the present invention.

DETAILED DESCRIPTION OF THE PREFERRED EMBODIMENTS

Figure 1:
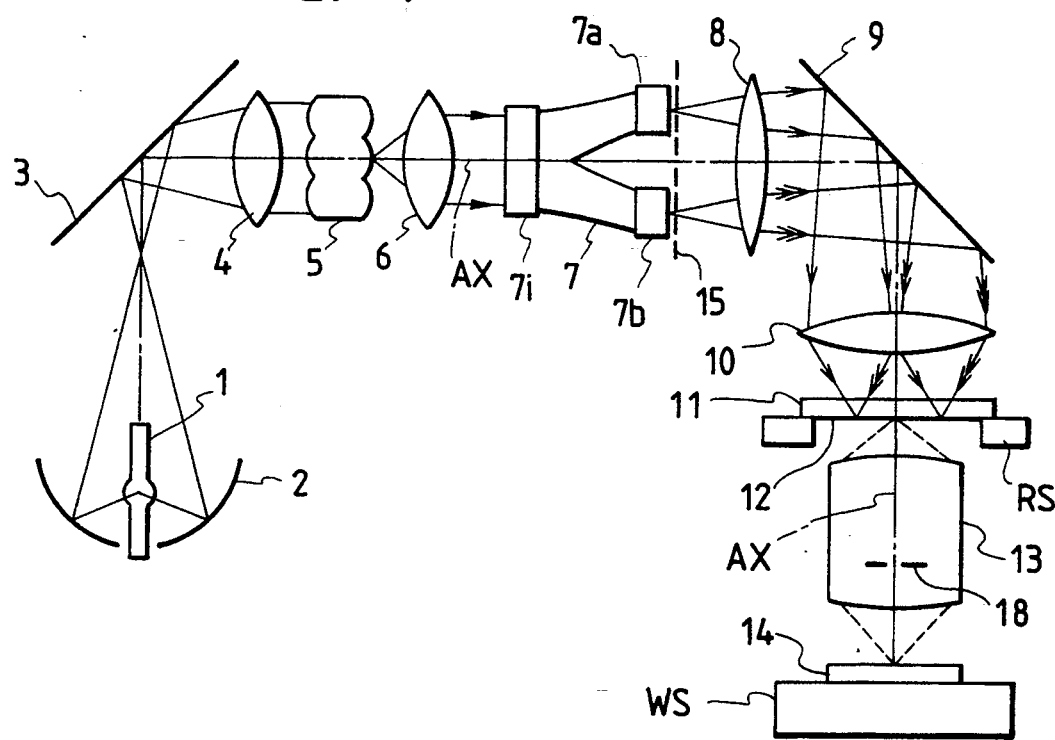
FIG. 1 shows a schematic view of a projection type light exposure apparatus in accordance with a first embodiment of the present invention.

FIG. 1 shows a schematic view of a projection type light exposure apparatus in accordance with a first embodiment of the present invention. A light beam generated by a light source 1 is reflected by an elliptic mirror 2 and a reflection mirror 3 and directed to a flyeye lens 5 through a lens system 4. The light beam transmitted through the flyeye lens 5 is directed to a light beam splitter 7 such as an optical fiber through a lens system 6. The beam splitter 7 splits a light beam applied to an input area 7i into a plurality of beams which exit from a plurality of exit areas 7a and 7b, which are provided in a plane (a pupil plane of an illumination optical system) which is a Fourier plane through lens systems 8 and 10 and a reflection mirror 9 for a plane in which a pattern 12 on a reticle 11 is present, or in a plane in the vicinity of the pupil plane. Distances of the exit areas 7a and 7b from an optical axis AX are determined by an angle of incidence of the illumination light beam to the reticle 11. The plurality of light beams which exit from the exit areas 7a and 7b illuminate the reticle 11 with a predetermined angle of incidence through the lens system 8, the reflection mirror 9 and the lens system 10. The reticle 11 is mounted on a reticle stage RS. A diffracted light generated by a pattern 12 on the reticle is focused onto a wafer 14 through a projection optical system 13 to transfer an image of the pattern 12. The wafer 14 is mounted on a wafer stage WS which is two-dimensionally movable in a plane normal to the optical axis AX so that a transfer area of the pattern 12 is sequentially moved. The light exposure apparatus has a shutter for controlling the light intensity to the reticle 11 and an illumination meter in the illumination optical system. The light source 1 may be a brilliant line lamp such as a mercury lamp or a laser light source. In the present embodiment, the beam splitter 7 which splits the illumination light beam is the optical fiber, although it may be other material such as a diffraction grating or a multi-plane prism.

The light source 1 is conjugate with the exit plane of the flyeye lens (the pupil plane 15 of the illumination optical system), the exit plane of the optical fiber 7 and the pupil plane 18 of the projection optical system 13, and the input plane of the flyeye lens 5 is conjugate with the input plane of the optical fiber 7, the pattern plane of the reticle 11 and the transfer plane of the wafer 14.

An additional flyeye lens may be provided for unifying the illumination on the side of the beam splitter 7 which faces the reticle 11, that is, in the vicinity of the exit planes of the exit areas 7a and 7b. The flyeye lens may be single or comprise a plurality of flyeye lenses. A wavelength selection element (such as an interference filter) may be provided in the illumination optical system depending on a correction status of chrominance aberrations of the projection optical system 13 and the illumination optical systems 1-10.

When a reticle having a pattern pitch which is smaller than a resolution limit is illuminated by a prior art apparatus, only a 0-order light of diffracted lights generated by a fine cyclic pattern can pass through the projection optical system 13 and the pattern cannot be imaged. However, even with such a pattern, when the reticle is illuminated by the present apparatus, the illumination light beams which exit from the exit areas 7a and 7b of the beam splitter 7 are directed to the reticle 11 with the predetermined angle, and two light beams, one from ±1-order diffracted lights generated by the reticle pattern, and the 0-order diffracted light can pass through the pupil plane of the projection optical system.

The patterns of the reticle used in the embodiment of the present invention are now explained with reference to FIGS. 5A, 5B, 6, 7, 8 and 9.

FIG. 5A illustrates a pattern of the reticle used in the light exposure method of the present invention. A light shielding member (hatched area) such as chromium is patterned, as a circuit pattern, on one surface of the reticle 11 which is a light transmissible glass substrate. Light transmissive areas 12a, 12b and 12c which are in a discrete space pattern are provided in the light shielding member. FIG. 5B shows another pattern of the reticle used in the light exposure method of the embodiment of the present invention. Light shielding areas 12d, 12e and 12f in a discrete line pattern are patterned on the reticle 11. The light transmissive area 12a and the light shielding area 12d are circuit patterns to be transferred, and the light transmissive areas 12b and 12c and the light shielding areas 12e and 12f are auxiliary patterns having a width shorter than the resolution limit of the projection optical system.

FIGS. 6, 7, 8 and 9 show patterns of the reticle used in the light exposure method of the embodiment of the present invention. FIG. 6 shows a plan view of the same discrete space pattern as that shown in FIG. 5A. Auxiliary patterns 12h and 12i (light transmissive areas) are drawn on the opposite sides of a circuit pattern 12g. An auxiliary pattern to the space pattern is added only widthwise (lateral) of the pattern 12g although an auxiliary pattern may be added to a leading end of the length (longitudinal) of the pattern 12g. In this case, the change of length of the pattern 12g due to defocusing may be reduced.

In FIG. 7, an auxiliary pattern 12k which is a frame-shaped light transmissive area is formed in a light shielding area 12l surrounded by a circuit pattern 12j formed by a grid-like light transmissive area.

Figure 8:
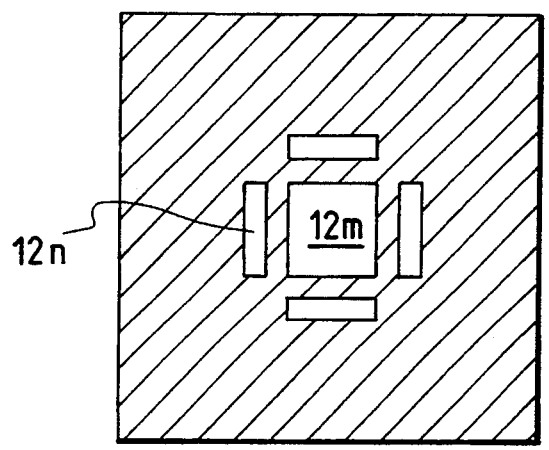
FIG. 8 shows a pattern of the reticle used in the light exposure method in accordance with the embodiment of the present invention.
Figure 9:
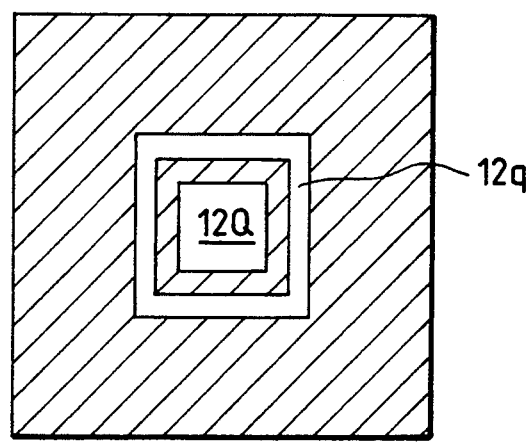
FIG. 9 shows a pattern of the reticle used in the light exposure method in accordance with the embodiment of the present invention.

In FIG. 8, a plurality of auxiliary patterns 12n are provided in the vicinity of each side of a hole pattern 12m. As shown in FIG. 9, an auxiliary pattern 12q may be provided to surround a hole pattern 12o. The hole pattern 12o is not limited to square but it may be circular or octagonal.

In any case, the width (shorter side) of the auxiliary pattern is no larger than the resolution limit of the projection optical system of the projection type light exposure apparatus to be used. The distance from the circuit pattern is in the order of the resolution limit of the projection optical system of the projection type light exposure apparatus to be used.

The reticle having the auxiliary pattern drawn beside the circuit pattern is illuminated by a light beam confined to pass through a local area centered at a point eccentric from the optical axis of the illumination optical system in the pupil plane of the illumination optical system, and it is projected onto the wafer through the projection optical system. This light exposure method is explained with reference to FIGS. 10A to 10C.

Figure 10A:
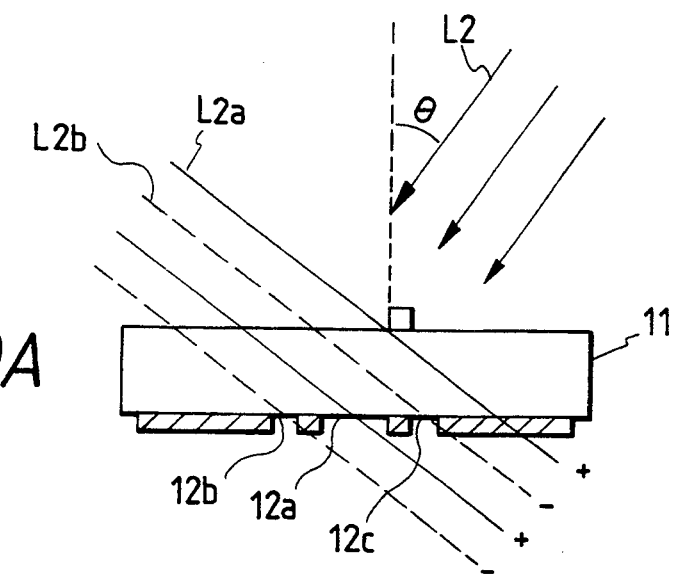
FIG. 10A illustrates the irradiation of the illumination light beam to the reticle in the light exposure method in accordance with the embodiment of the present invention.
Figure 11A:
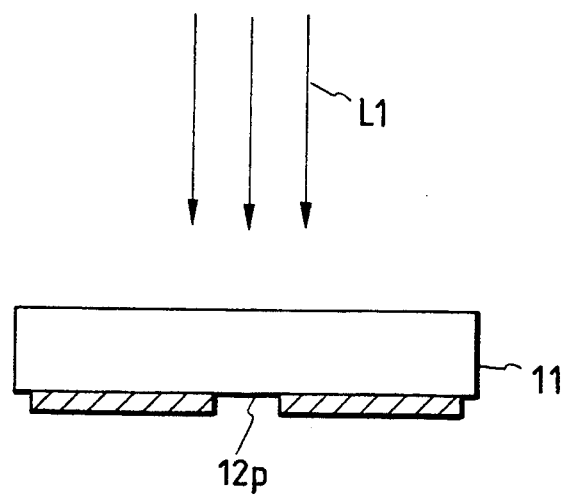
FIG. 11A illustrates the irradiation of the illumination light beam to the reticle when illuminated by a prior art light exposure method.

FIG. 10A illustrates the irradiation of the illumination light beam to the reticle when illuminated by the light exposure method of the embodiment of the present invention. The auxiliary patterns 12b and 12c of no larger than the resolution limit of the projection optical system are provided in the vicinity of the circuit pattern 12a to be transferred, on the pattern plane of the reticle 11. The width of the circuit pattern 12a is same as that of the circuit pattern 12p shown in FIG. 11A. When the reticle is illuminated by the light beam confined to pass through the local area centered at the position eccentric from the optical axis of the illumination optical system in the pupil plane of the illumination optical system, the illumination light beam L2 is applied to the pattern with an inclined angle position (not normally). By determining the center position of the local area through which the light beam passes such that the angle and the direction are optimum to the line widths and the directivities of the circuit pattern 12a and the auxiliary patterns 12b and 12c, the circuit pattern 12a may be illuminated with a positive amplitude and the auxiliary patterns 12b and 12c are illuminated with a negative amplitude. Of the equi-wave planes of the illumination light beam L2, one having the positive amplitude is shown by a solid line L2a and one having the negative amplitude is shown by a broken line L2b. An angle of incidence $\theta$ of the illumination light beam to the pattern is given by $\sin\theta = \lambda/d$ where d is a distance between the auxiliary patterns 12b and 12c. The direction of incidence includes a direction vector in the direction of pattern drawing (the longitudinal direction of the pattern, which is normal to the plane of drawing in FIG. 10A) and in the plane defined by the angle of incidence $\theta$. This will be discussed hereinlater.

Figure 10B:
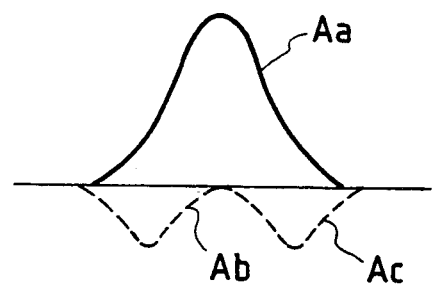
FIG. 10B shows an amplitude distribution of a light transmitted through the pattern when illuminated by the light exposure method in accordance with the embodiment of the present invention.
Figure 10C:
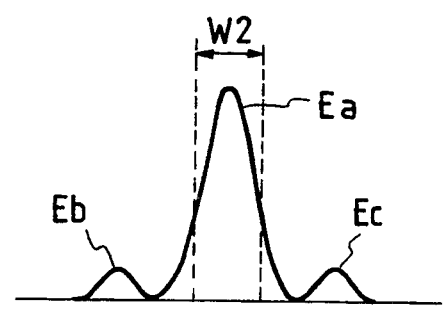
FIG. 10C shows an image intensity distribution of the pattern when illuminated by the light exposure method in accordance with the embodiment of the present invention.
Figure 11B:
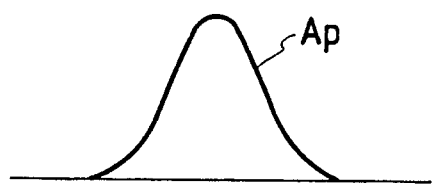
FIG. 11B shows an amplitude distribution of a light transmitted through the pattern when illuminated by the prior art light exposure method.
Figure 11C:
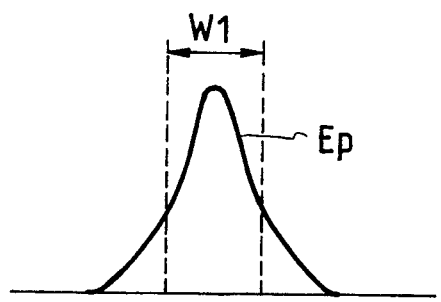
FIG. 11C shows an image intensity distribution of the pattern when illuminated by the prior art light exposure method.

FIG. 10B shows an amplitude distribution of the light which is transmitted through the pattern in the light exposure method shown in FIG. 10A. The complex amplitudes of the lights which pass through the circuit pattern 12a and the auxiliary patterns 12b and 12c are +, − and −, respectively. As a result, a positive amplitude distribution Aa and negative amplitude distributions Ab and Ac appear on the wafer. Since the widths of the circuit pattern 12a and the circuit pattern 12p are substantially equal, the amplitude distribution Aa of the image of the pattern 12a is substantially equal to that of the amplitude distribution Ap created by a prior art light exposure method shown in FIG. 11B. In the present invention, however, the amplitude distributions Ab and Ac from the auxiliary patterns 12b and 12c are added thereto. As a result, the amplitude distribution Aa (>0) from the circuit pattern and the amplitude distributions Ab and Ac (<0) from the auxiliary patterns cancel out each other, resulting in a sharp peak Ea in the intensity distribution of the image as shown in FIG. 10C. In the intensity distribution Ea, the width having the strength to sensitize the resist on the wafer (the exposure strength to completely remove or preserve by development) is shown by a width $W_2$ which is narrower than the width $W_1$ in FIG. 11C. Accordingly, it is possible to transfer the pattern having the finer width $W_2$ than the width $W_1$ of the prior art method.

Figure 2:
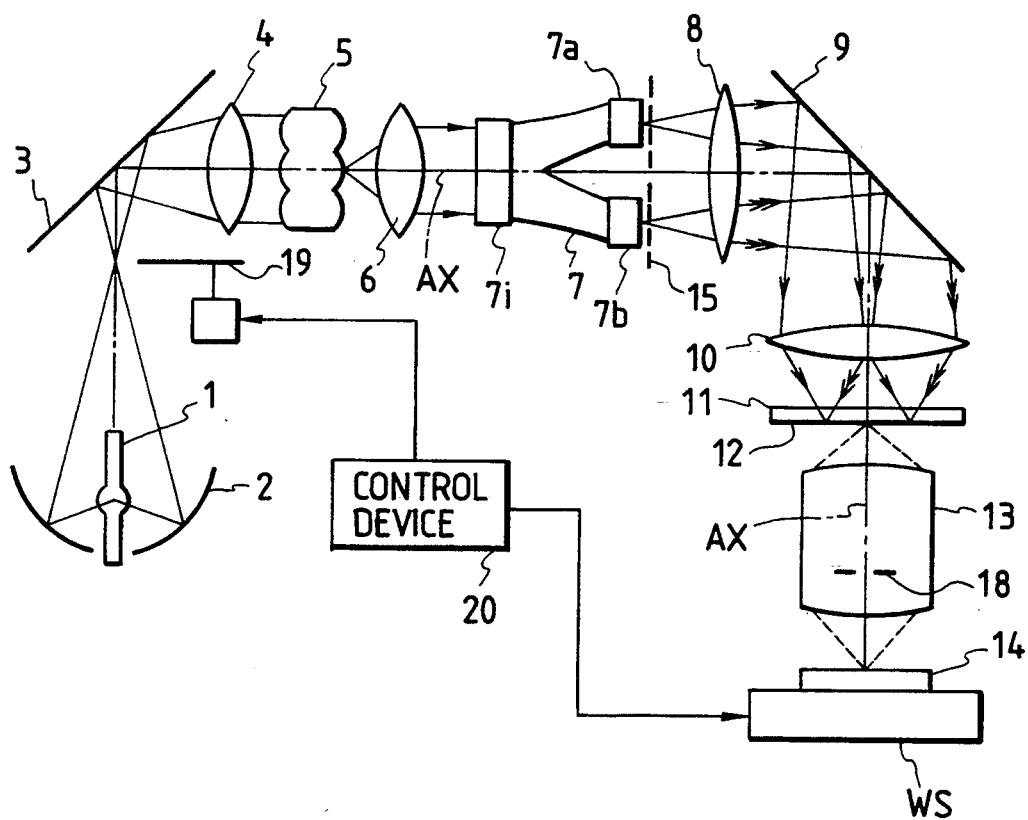
FIG. 2 shows a schematic view of the projection type light exposure apparatus in accordance with a second embodiment of the present invention.

FIG. 2 shows a schematic view of the projection type light exposure apparatus in accordance with a second embodiment of the present invention. It is basically of the same configuration as that of the apparatus shown in FIG. 1. A shutter 19 is movable forward and backward to the light beam in the illumination optical system including the light source 1 to the lens system 10. The shutter 19 controls the irradiation of the illumination light beam to the reticle 11, that is, the exposure of the circuit pattern 12 to the wafer 14. The diffracted light generated by the pattern 12 on the reticle 11 is focused onto the wafer 14 through the projection optical system 13 to transfer the image of the pattern 12. The wafer 14 is mounted on the movable stage WS which is moved or vibrated along the optical axis AX of the projection optical system 13. The movable stage WS is electrically connected to the control unit 20 and the shutter 19 is also electrically connected to the control unit 20, which issues an open/close command to the shutter 19 and a move/vibrate command to the movable stage WS. The movement condition (relationships between a movement position and a moving velocity, and between the moving velocity and a moving time) of the movable stage WS may be determined by the control unit 20, or the control unit 20 may be provided with input means for the movement condition so that an operator may enter the condition. In any case, it is desirable that the moving range or the vibration amplitude of the movable stage WS is determined by taking the focal depth of the projection optical system 13 and the surface condition (such as the step) of the wafer 14 into consideration. The light exposure apparatus of the present embodiment has a light intensity meter to measure the light intensity applied to the reticle 11 in the illumination optical system as the light exposure apparatus of FIG. 1 does.

The light source 1 is conjugate with the shutter 19, the exit plane (the pupil plane 15 of the illumination optical system) of the flyeye lens 5, the exit plane of the optical fiber 7 and the pupil plane 18 of the projection optical system 13, respectively, and the plane of incidence of the flyeye lens 5 is conjugate with the plane of incidence of the optical fiber 7, the pattern plane of the reticle 11 and the transfer plane of the wafer 14, respectively.

Since the present apparatus is basically of the same configuration as that of the light exposure apparatus shown in FIG. 1, the pattern which is smaller than the resolution limit of the projection optical system as shown in FIGS. 5A, 5B–9 can be imaged. The second embodiment differs from the first embodiment in that the former is effective even if the width of the auxiliary pattern is of the same order as the width of the circuit pattern to be imaged.

Figure 10D:
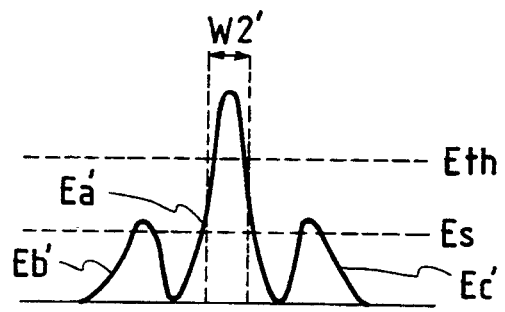
FIG. 10D shows an image intensity distribution of the pattern when illuminated by the light exposure method in accordance with the second embodiment of the present invention.

The operation when the size of the auxiliary pattern is of the same order as that of the circuit pattern is now explained. The circuit pattern is identical to the circuit pattern 12a shown in FIG. 10A and the illumination method is also identical. The sizes of the auxiliary patterns 12b and 12c are of the same order as that of the circuit pattern 12a shown in FIG. 10A. In such a case, the amplitude distribution of the light transmitted through the pattern includes large negative amplitudes in the amplitude distribution shown in FIG. 10B for the light components transmitted through the auxiliary patterns 12b and 12c. As a result, the intensity distribution Ea' of the image of the circuit pattern 12a has a sharper (narrower) peak than Ea of FIG. 10C, as shown in FIG. 10D so that the width $W_2'$ of the image of the circuit pattern 12a can be finner than the width $W_2$ shown in FIG. 10C. However, the intensities Eb' and Ec' of the images of the auxiliary patterns 12b and 12c are also enhanced so that an unnecessary pattern may be transferred onto the wafer. A light exposure level Eth shown by a broken line in FIG. 10D shows a level at which the positive resist is completely removed, and a light exposure level Es shows a level at which the film of the positive resist start to be thinned. Thus, when the light exposure is higher than Eth, the resist is completely removed, and when the light exposure is lower than Es, the resist is completely left without thinning. Accordingly, of the intensity distribution shown in FIG. 10D, Eb' and Ec' show levels at which the positive resist remains while it is thinned. In the light of the above, optimum widths of the auxiliary patterns 12b and 12c are selected in accordance with the characteristic of the resist and the light exposure level. Alternatively, the light exposure levels may be selected such that only Ea' exceeds Eth, and Eb' and Ec' are lower than Es. In FIG. 10D, the intensity distribution and the light exposure are shown in one figure although they are considered equivalent.

In the second embodiment of the present invention, when the circuit pattern 12 is exposed onto the wafer 14 by the above illumination method, a progressive focus light exposure method in which the wafer 14 and the focus plane of the projection optical system 13 are relatively moved or vibrated along the optical axis AX during one exposure is used. In the progressive focus light exposure method, the moving range or the vibration range determined by taking the focal depth of the projection optical system 13 and the step on the wafer surface into consideration is divided into a plurality of steps, for example, a lower area, a middle area and an upper area. One split light is exposed for each step, and when the light exposures for all steps are completed, one cycle of light exposure is completed.

A reason why the apparent focal depth on the wafer if expanded by the movement or the vibration of the wafer along the optical axis during the light exposure in the light exposure method of the second embodiment of the present invention is explained with reference to FIGS. 13A–13F.

FIG. 13A shows intensity distributions of light exposures applied to the lower area of the step in the stepwise exposure by the light exposure method of the second embodiment of the present invention. FIG. 13B shows intensity distributions of light exposures applied to the middle area of the step, and FIG. 13C shows intensity distributions of light exposures applied to the upper area of the step. The lower area position is represented by $-Z$, the middle area position is represented by $Z_0$, and the upper area position is represented by $+Z_1$. The pattern to be exposed is the hole pattern (fine rectangle) 12m shown in FIG. 8. The intensity distribution of the projected image of the hole pattern 12m on the wafer 14 is shown by Fmn where m=1 represents the focus position $-Z_1$, m=2 represents the focus position $Z_0$ and m=3 represents the focus position $+Z_1$, and n=1, 2 and 3 represent the number of times (sequence) of the light exposure. Namely, $F_{11}$ represents the intensity distribution for the first light exposure at the focus position $-Z_1$, $F_{22}$ represents the intensity distribution for the second light exposure at the focus position $Z_0$, and $F_{33}$ represents the intensity distribution for the third light exposure at the focus position $+Z_1$. The same convention is applied to $F_{11}'$ and $F_{33}'$.

When the best focus plane of the projection lens is focused to the lower area (position $-Z_1$) of the step of the pattern on the wafer and the first light exposure is effected, a sharp intensity distribution $F_{11}$ appears for the lower area of the step as shown in FIG. 13A, and as it goes to the middle area and the upper area of the step, the intensity distribution $F_{11}$ rapidly deteriorates (the reduction of the peak value and the increase of the width) as shown in FIGS. 13B and 13C. When the best focal plane is focused to the middle area (position $Z_0$) of the step of the pattern and the second light exposure is effected, a sharp intensity distribution $F_{22}$ appears in the middle area but the deteriorated intensity distribution $F_{22}'$ appears in the lower area and the upper area. Similarly, at the third light exposure, the best focal plane is focused to the upper area (position $+Z_1$) of the step of the pattern and the sharp intensity distribution $F_{33}$ appears in the upper area, and as it goes to the middle area and the lower area, the intensity distribution is deteriorated as shown by $F_{33}'$.

Through the three times of light exposure, the sharp image distribution $F_{11}$, $F_{22}$ or $F_{33}$ appears at least once in each of the upper, middle and lower areas of the step of the pattern.

As shown in FIG. 13A, the accumulated light intensity of the intensity distributions $F_{11}$, $F_{22}'$ and $F_{33}'$ is applied to the resist in the lower area, The accumulated light intensity distribution is shown in FIG. 13D, in which a broken line level Eth shows a light exposure level required to sensitize the positive resist. Similarly, the accumulated light intensity of the intensity distributions $F_{22}$, $F_{11}'$ and $F_{33}'$ as shown in FIG. 13E is applied to the resist in the middle area of the step of the pattern, and the accumulated light intensity of the intensity distributions $F_{33}$, $F_{11}'$ and $F_{22}'$ as shown in FIG. 13F is applied to the resist in the upper area of the step of the pattern. In each of the three step areas, the good image intensity distribution of the hole pattern is applied to the resist. In this manner, the apparent focal depth is expanded over the width of $2Z_1$ from the upper area to the lower area of the step.

In the present embodiment, the wafer positions during the light exposure are three discrete positions although the same effect is attained when the positions are continuously changed. The shutter 19 may be repeatedly opened and closed for each stepwise light exposure or it may be kept open until the entire stepwise light exposure is completed and closed when one cycle of light exposure is completed. In the present embodiment, the wafer 14 is moved although the focal plane of the projection optical system may be moved by moving at least one of the optical members of the projection optical system. For example, an apparatus disclosed in U.S. Pat. No. 4,869,999 or an apparatus disclosed in U.S. application Ser. No. 709,278 (filed on Jun. 3, 1991) may be used.

In the above embodiments, the reticle includes the circuit pattern comprising the light transmissive areas and the auxiliary pattern (discrete space pattern) although the same effect may be attained when a reticle including patterns both having light shielding areas (discrete line pattern) is used. This corresponds to the so-called theory of Vabine.

When the pattern including the circuit pattern and the auxiliary patterns both comprising the light shielding areas and other areas comprising the light transmissive areas is used, a new effect is brought by the use of the progressive focus light exposure method. This is explained with reference to FIGS. 14, 15A–15C and 16.

Figure 15A:
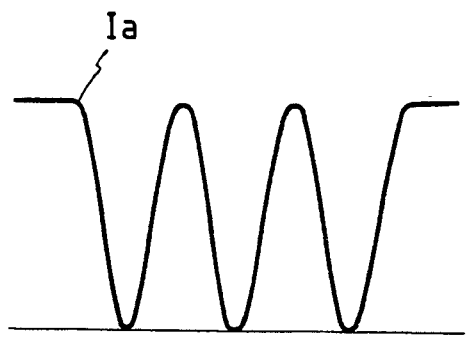
FIG. 15A shows an intensity distribution of a projected image at a best focus position.
Figure 15B:
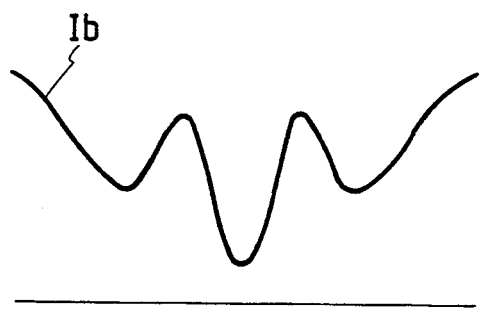
FIG. 15B shows an intensity distribution of the projected image at a defocus position.
Figure 15C:
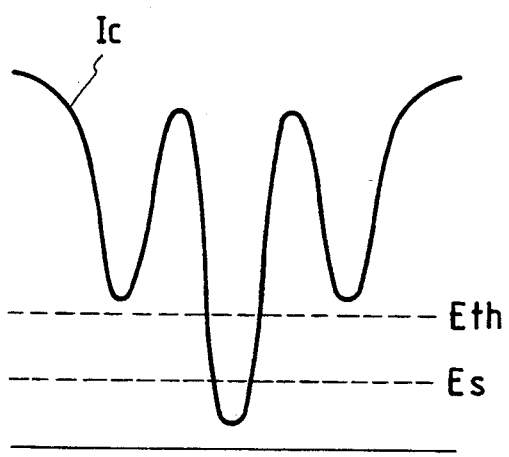
FIG. 15C shows a sum of the intensity distribution of the projected image at the best focus position and the intensity distribution of the projected image at the defocus position.

FIG. 14 shows another example of the pattern of the reticle used in the light exposure method in the second embodiment of the present invention. In the present example, both the circuit pattern and the auxiliary pattern include the light shielding areas (discrete line pattern). A circuit pattern 12r is formed on the reticle, and auxiliary patterns 12s and 12t are formed in the vicinity thereof. The width of the auxiliary patterns 12s and 12t is equal to that of the circuit pattern 12r. The interval between the auxiliary patterns 12s and 12t and the circuit pattern 12r is also equal to the width of the circuit pattern 12r. The intensity distributions of the projected images produced when the pattern shown in FIG. 14 is illuminated by the light exposure method of the embodiment of the present invention are shown in FIGS. 15A–15C. FIG. 15A shows an intensity distribution Ia of the projected image at the best focus position, FIG. 15B shows an intensity distribution Ib of the projected image at a defocus position, and FIG. 15C shows an intensity distribution Ic which is a sum of the intensity distribution Ia at the best focus position and the intensity distribution Ib at the defocus position. It corresponds to an image produced when the wafer is moved or vibrated along the optical axis of the projection optical system during the light exposure (when the progressive focus light exposure method is used). In the image at the best focus position, the intensities of the images of the circuit pattern 12r and the auxiliary patterns 12s and 12t appear as very high contrast dark lines as shown in FIG. 15A. However, in the image at the defocus position, the image of the circuit pattern 12r appears as a high contrast dark line but the images of the auxiliary patterns 12s and 12t appear as low contrast and non-clear dark line. Since the intensity distribution Ic of the image produced when the wafer is moved or vibrated along the optical axis of the projection optical system is the sum of the intensity distributions Ia and Ib, the image of the circuit pattern 12r is very dark but the images of the auxiliary patterns 12s and 12t are not so dark. When the positive resist is used and the light exposure level Es at which the resist starts to be thinned and the light exposure level Eth at which the resist is completely removed are set as shown in FIG. 15C (in actual, the light exposure is set such that the intensity distribution Ic has the intensities shown in FIG. 15C for the light exposure levels Es and Eth, that is, the intensity for the image of the center circuit pattern is lower than the light exposure level Es and the intensity for the images of the opposite auxiliary patterns is higher than the light exposure level Eth), a very fine line pattern (a pattern with residual resist) may be formed on the wafer. The auxiliary patterns 12s and 12t may be finner than the circuit pattern 12r, but it is preferable for improving the resolution power (the fineness of the line width) that the patterns are of the same dimension as that of the circuit pattern 12r, as explained in FIG. 10D. Besides the present example of the pattern, a pattern having a shape as shown in FIG. 7 with the reversed light shielding area and the light transmissive area, that is, a pattern having a light transmissive area surrounded by the circuit pattern formed by the grid-like light shielding area and the auxiliary pattern formed therein by the frame-shaped light shielding area maybe used.

Figure 16:
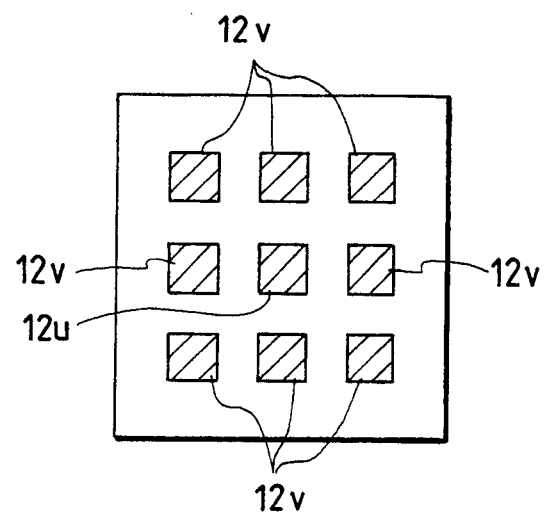
FIG. 16 shows other pattern of the reticle used in the light exposure method in accordance with the second embodiment of the present invention.
Figure 17:
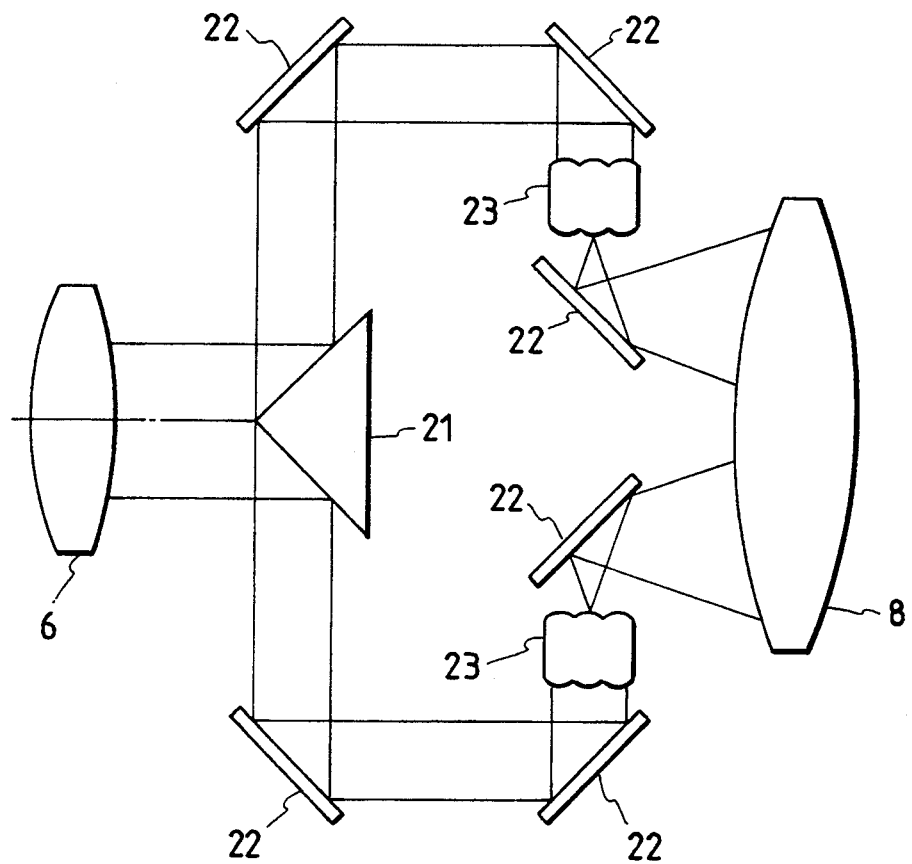
FIG. 17 shows another means for forming the local area through which the illumination light beam passes in the pupil plane of the illumination optical system of the projection type light exposure apparatus in accordance with the embodiment of the present invention.

FIG. 16 shows an example in which a circuit pattern 12u formed by a square light shielding area and auxiliary pattern areas 12v arranged in the vicinity thereof and formed by light shielding areas of the same size and shape as those of the circuit pattern 12u. The light shielding areas 12u and 12v shown in FIG. 16 are arranged at predetermined vertical and horizontal pitches. The pattern shown in FIG. 16 may be considered as an expansion of the pattern of FIG. 14 to a two-dimensional pattern, and the image thereof is essentially same as that shown in FIG. 15. Accordingly, when the pattern shown in FIG. 16 is used and the positive resist is used, a very fine discrete island (with a residual local or island-like resist area) pattern may be formed. The size of the auxiliary pattern 12v may be smaller than that of the circuit pattern 12u, but it is preferably of the same dimension in order to improve the resolution power of the circuit pattern 12u. The shape of the auxiliary pattern 12v may not be same as that of the circuit pattern 12u. The same is true for a pattern having the shape as shown in FIG. 9 with the reversed light shielding area and light transmissive area, that is, a pattern having a rectangular light shielding area and a frame-shaped light shielding area with a light transmissive area interposed therebetween. In the present embodiment, the patterns shown in FIGS. 14 and 16 are exposed to the positive resist although the same effect may be attained when they are exposed to a negative resist. In this case, the pattern of FIG. 14 is a discrete space pattern (the pattern having the resist linearly removed) and the pattern of FIG. 16 is a discrete hole pattern (the pattern having the resist locally removed). The light exposure level Eth shown by a broken line in FIG. 15C represents a light exposure level at which the negative resist completely remains, and Es represents a light exposure level at which the negative resist is completely removed. When the light exposure level is higher than Eth, the negative resist completely remains without thinning, and when the light exposure level is lower than Es, the resist is completely removed. For the presently available photo-resist, Eth=2Es for both the positive resist and the negative resist.

When the pattern including the circuit pattern and the auxiliary pattern both formed by the light shielding areas is used, the intensity distribution of the image on the wafer is Ic shown in FIG. 15C, and the auxiliary pattern is not transferred even if the auxiliary pattern is of the same size as the circuit pattern, or it may be rather said that a very fine pattern can be transferred when the sizes are equal. Namely, when the width of the auxiliary pattern is of the same order as that of the circuit pattern in order to improve the resolution power, even the auxiliary image may be transferred. In order to prevent such a transfer, the progressive focus light exposure method is used. On the other hand, when the pattern (space pattern) including the circuit pattern and the auxiliary pattern both formed by the light transmissive areas is used, the size of the auxiliary pattern may be of the same order as that of the circuit pattern as explained by the example of FIG. 10D. However, in the case of the space pattern, the thinning of the resist is more likely to occur than the pattern (line pattern) formed by the light shielding areas, because the curves of the intensity distributions of the pattern images are completely opposite with respect to the light exposure levels Eth and Es, for the space pattern and the line pattern. In brief, when the line pattern is used, it is easier to control the image intensity with respect to the light exposure levels Eth and Es. In other words, when the space pattern is used, the control is more difficult because the intensity distribution of the image necessarily falls into a range affected by the light exposure levels Eth and Es.

In the projection type light exposure apparatus used in the embodiments of the present invention, it is preferable that the center position of the local area through which the illumination light beam passes in the pupil plane of the illumination optical system, that is, the positions of the exit areas 7a and 7b of the beam splitter (optical fiber) 7 shown in FIG. 1 on the pupil plane 15 of the illumination optical system is variable in accordance with the direction pitch and width of the pattern of the reticle (the longitudinal direction of the linear pattern) to be used because the angle of incidence and the direction of incidence of the illumination light beam to the reticle are determined by the direction, width and pitch of the patterns (particularly the interval of the auxiliary patterns). In other words, the reticle is preferably illuminated by the light beam such that the equiwave planes of the opposite phases reaches the circuit pattern to be transferred and the auxiliary patterns in the vicinity thereof. The direction of eccentricity from the optical axis AX in the pupil plane of the illumination optical system is determined in accordance with the direction of incidence thus determined, and the amount of eccentricity from the optical axis AX is determined in accordance with the angle of incidence.

When the one-dimension space pattern shown in FIG. 6 (or the line pattern) is used, the illumination light beam may be directed to the pattern on the reticle in the direction shown in FIG. 10A. FIG. 10A shows a sectional view of the circuit pattern 12a and the auxiliary patterns 12b and 12c along a direction perpendicular to the drawing direction of the patterns. The illumination light beam L2 is directed to the reticle parallelly to the plane of the drawing. When the one-dimension space pattern or line pattern is used, the direction of incidence of the illumination light beam to the reticle is preferably illuminated by two light beams, the illumination light beam L2 inclined as shown in FIG. 10A and the light beam (not shown) which is symmetric to L2 with respect to the normal line to the reticle plane. Namely, the center positions of the local areas through which the illumination light beam passes in the pupil plane 15 of the illumination optical system are preferably two points which are symmetric with respect to the optical axis AX in order to reduce the deviation of the image (so-called telecentric deviation) due to the affect of the wave-front aberration when the wafer is defocused. When the wafer is exactly at the best focus position, the light beam in one direction as shown may be used so long as the interval and the directivity of the auxiliary patterns on the reticle 11 are fixed. The center positions of the local areas through which the illumination light beam passes in the pupil plane of the illumination optical system of the projection type light exposure apparatus are determined in the manner described above.

When the grid-like pattern shown in FIG. 7 or the hole pattern shown in FIG. 8 or 9 is used, the pattern includes the auxiliary patterns in the two-dimentional directions. In this case, the illumination light beam is directed in the direction perpendicular to the drawing direction of the auxiliary pattern. Accordingly, the center positions of the local areas through which the illumination light beam passes in the pupil plane of the illumination optical system may be the two points or four points determined in the manner described above. When the two-dimensionally drawn pattern is to be illuminated, the center positions of the local areas through which the illumination light beam passes are two points which are optimum to the two-dimensional auxiliary pattern if two points which are eccentric from the optical axis AX are to be used, or two more points which are symmetric to the above two points with respect to the optical axis AX are added if four points are to be used. When the center points are four points, the center of gravity of the entire illumination light beam can be more aligned to the optical axis AX so that the lateral position deviation (telecentric deviation) of the image caused when the wafer is slightly defocused can be prevented.

Figure 12A:
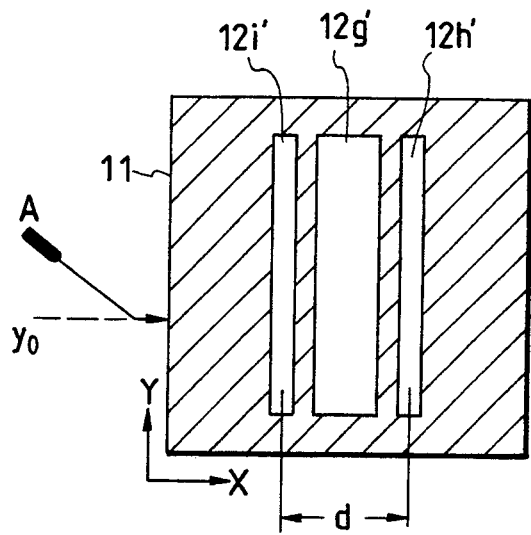
FIGS. 12A and 12C show examples of portions of patterns formed on the reticle.
Figure 12C:
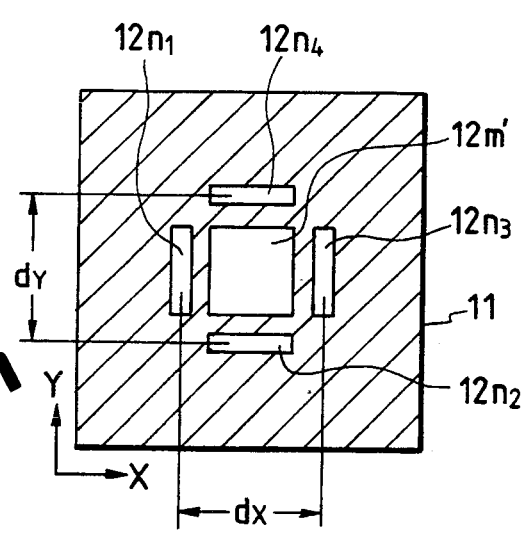
Figure 12B:
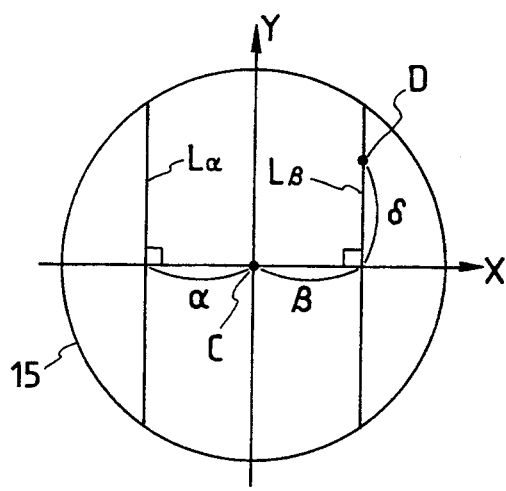
FIG. 12B shows a center position of a local area through which the illumination light beam passes in a pupil plane of an optimum illumination optical system when the pattern shown in FIG. 12A is used.
Figure 12D:
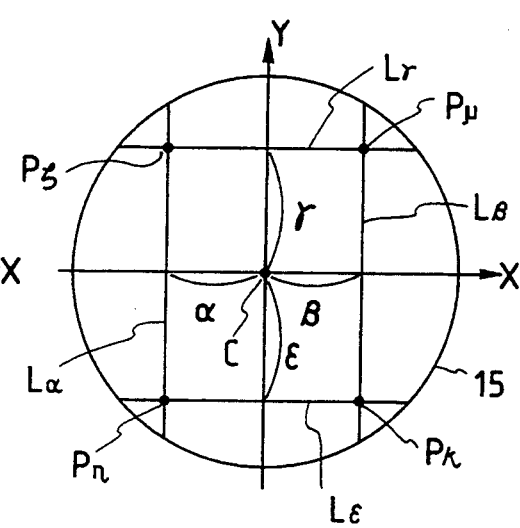
FIG. 12D shows a center position of the local area through which the illumination light beam passes in the pupil plane of an optimum illumination optical system when the pattern shown in FIG. 12C is used.

In the above embodiments, the light beam is irradiated in the direction perpendicular to the drawing direction of the pattern, but as described above, the angle of incidence and the direction of incidence of the illumination light beam to the pattern are determined by the interval of the pattern on the reticle and the auxiliary pattern, and the drawing directions of the patterns. This is further explained with reference to FIGS. 12A-12D. FIGS. 12A and 12C show portions of patterns formed on the reticle 11. FIG. 12B shows the center position of the local area through which the illumination light beam passes in the pupil plane 15 of the illumination optical system optimum to the pattern of FIG. 12A (which is the position of the secondary light source image by the beam splitter and represents the center of the illumination light beam), and FIG. 12D shows the position of the secondary light source image optimum to the pattern of FIG. 12C.

FIG. 12A shows a one-dimensional discrete space pattern which comprises a circuit pattern 12g (light transmissive pattern) and auxiliary patterns 12i' and 12h' on the opposite sides thereof. As described above, the width of the auxiliary patterns 12i' and 12h' is smaller than the resolution limit. The interval of the auxiliary patterns 12i' and 12h' is d.

FIG. 12B shows the positions of the secondary light source images (exit areas 7a-7d) in the pupil plane 15 of the illumination optical system optimum to the pattern of FIG. 12A. The optimum positions of the secondary light source images produced on a Fourie transform plane are at points on a line Lα and a line Lβ along a Y-axis assumed in the pupil plane as shown in FIG. 12B which shows the pupil plane 15 for the pattern as viewed along the optical axis and in which the XY coordinates in the pupil plane 15 are same as those of FIG. 12A which views the pattern along the same direction. The lines Lα and Lβ are spaced from the center c at which the optical axis passes by α and β, respectively, where $\alpha = \beta = f \cdot \lambda / d$, λ is an exposure light wavelength, and f is a focal length of the optical system (lens or a set of lenses) which Fourier-transforms the pattern plane of the reticle and the pupil plane 15. The illumination light beams emitted along the lines Lα and Lβ are directed to the reticle plane with inclinations to the pattern (nonperpendicularly). When a section A-B perpendicular to the drawing direction of the discrete space pattern shown in FIG. 12A is assumed, the amplitudes of the light beams irradiated to the auxiliary patterns 12$i'$ and 12$h'$ and the circuit pattern 12$g'$ are of the opposite polarities (opposite phases). For example, the illumination light beam emitted from the point D shown in FIG. 12B has the following amplitude distribution on the pattern plane of the reticle 11.

$$\phi = exp\{-2\pi i(\beta x/f\lambda + \delta y/f\lambda)\}$$

where $\beta = f\lambda/d$
Accordingly, $$\phi = exp\{-2\pi i(x/d + \delta y/f\lambda)\}$$

Assuming that the y coordinate of the section A-B in FIG. 12A is $Y_0$, the amplitude $\phi_0$ of the illumination light at $y=Y_0$ is given by $$\phi_0 = exp(-2\pi ix/d)x\ exp(-2\pi i\delta y_0/f\lambda)$$

where $exp\ (-2\pi i\delta y_0/f\lambda)$ is constant for x.

Accordingly, the light amplitude in the section A-B is given by $$\phi_0 = const.\ x\ exp\ (-2\pi ix/d)$$

The distance between the circuit pattern 12$r$ and the auxiliary patterns 12$i'$ and 12$h'$ is equal to d/2. Assuming that the amplitude on the circuit pattern 12$g'$ is $$\phi_{0r} = const.\ x\ exp\ (-2\pi ix_0/d)$$

then, the amplitudes on the auxiliary patterns 12$i'$ and 12$h'$ are given by $$\phi_{0s} = const. \times exp\{-2\pi i(x_0 - d/2)/d\}$$
$$= \phi_{0r} \times exp\{2\pi i \times 1/2\}$$
$$= -\phi_{0r}$$

$$\phi_{0r} = const. \times exp\{-2\pi i(x_0 + d/2)/d\}$$
$$= \phi_{0r} \times exp\{2\pi i \times (-1/2)\}$$
$$= -\phi_{0r}$$

Accordingly, the amplitude of the illumination light on the circuit pattern 12$g'$ and the amplitude of the illumination light on the auxiliary patterns 12$i'$ and 12$h'$ may be of opposite polarities, that is, the phases of the wavefronts of the illumination light beams may be opposite as described above.

FIG. 12C shows a discrete hole pattern. A plurality of auxiliary patterns 12$n_1$–12$n_4$ are provided in the vicinity of each side of the hole pattern 12$m'$. The intervals of the auxiliary patterns are dx and dy in the X and Y directions, respectively. This pattern may be considered as a two-dimensional expansion of the pattern shown in FIG. 12A. Accordingly, the positions of the secondary light source images on the pupil plane 15 of the illumination optical system may be on the lines L$\alpha$ and L$\beta$ as they are in FIG. 12B, and additionally on lines L$\gamma$ and L$\epsilon$ shown in FIG. 12D. The positions on the lines L$\alpha$ and L$\beta$ correspond to the auxiliary patterns 12$n_1$ and 12$n_3$ along the X axis, and the positions on the lines L$\gamma$ and L$\epsilon$ correspond to the auxiliary patterns 12$n_2$ and 12$n_4$ along the Y axis. The position and rotation relationship between FIGS. 12C and 12D are identical to those between FIGS. 2A and 12B, and $$\alpha = \beta = f\lambda/dx$$

$$\gamma = \epsilon = f\lambda/dy$$

When the positions of the secondary light source image are at crosspoints P$\zeta$, P$\eta$, P$\kappa$ and P$\mu$ of the lines L$\alpha$ and L$\beta$ and the lines L$\gamma$ and L$\epsilon$ on the pupil plane 15, the light source positions are optimum to both the auxiliary patterns 12$n_1$ and 12$n_3$ along the X axis and the auxiliary patterns 12$n_2$ and 12$n_4$ along the Y axis. In FIGS. 12B and 12D, the actual positions (light intensity distribution) of the secondary light source images are not limited on the lines L$\alpha$, L$\beta$, L$\gamma$ and L$\epsilon$ but they may have certain spread (with a coherence factor $\sigma$ which will be discussed hereinlater) around the lines L$\alpha$, L$\beta$, L$\gamma$ and L$\epsilon$.

While the pattern having the two-dimensional directivity at one point on the reticle is used as the two-dimension pattern, the above method is also applicable where a plurality of patterns having different directivities at different points in one pattern. One example thereof is the pattern shown in FIG. 7.

When the pattern on the reticle has a plurality of directivities or a plurality of different intervals of the auxiliary patterns, the optimum positions of the secondary light source images depend on the directivities and the intervals of the patterns as described above, although the secondary light source image may be arranged at an average position of the optimum positions. The average position may be a weighted average weighted by the fineness and significance of the pattern.

Figure 3:
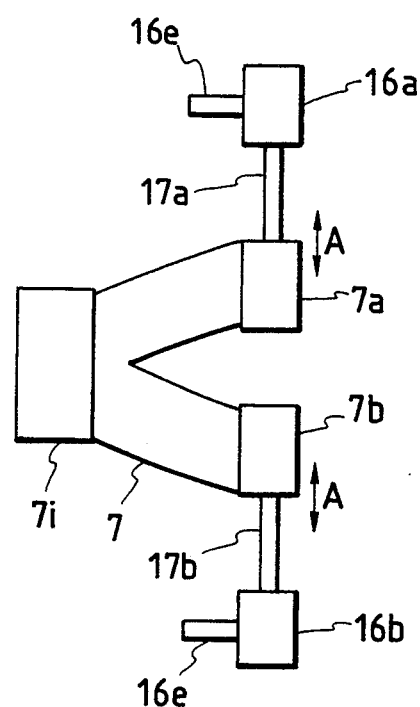
FIG. 3 shows a side view of a light beam splitter and a drive member of the projection type light exposure apparatus in the embodiment.
Figure 4:
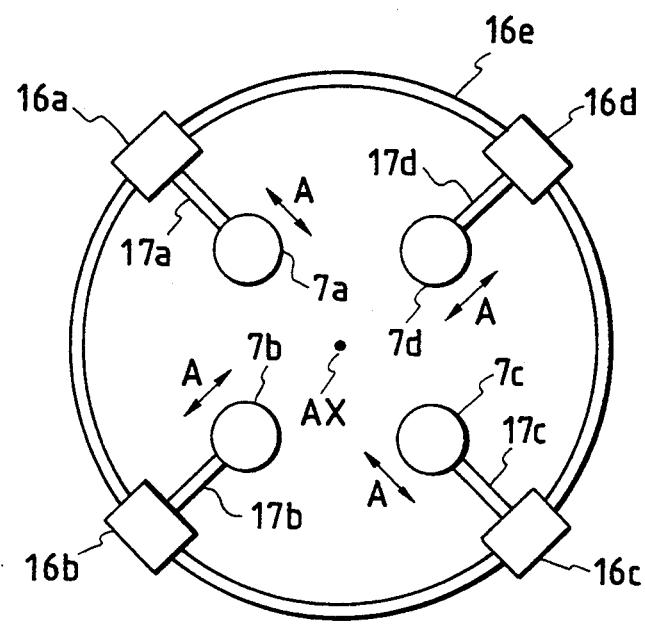
FIG. 4 shows a plan view of the light beam splitter and the drive member of the projection type light exposure apparatus in the embodiment.

In the light of the above, it is desirable that the light exposure apparatus for the light exposure methods in accordance with the embodiments of the present invention is provided with a light intensity distribution control function as shown in FIGS. 3 and 4. A configuration of an exit area and a drive member is explained with reference to FIGS. 3 and 4.

FIGS. 3 and 4 show schematic views of a light beam splitter and a drive member of the projection type light exposure apparatus in one embodiment of the present invention. FIG. 3 shows a construction as viewed normally to the optical axis of the light exposure apparatus, and FIG. 4 shows a construction as viewed along the optical axis. It has four points through which the primary light beam of the illumination light beam passes in the pupil plane of the illumination optical system. The exit areas 7$a$, 7$b$, 7$c$ and 7$d$ are connected to the drive members 16$a$, 16$b$, 16$c$ and 16$d$ through the variable length support rods 17$a$, 17$b$, 17$c$ and 17$d$, and movable along a direction A. The drive members 16$a$, 16$b$, 16$c$ and 16$d$ are movably supported by the support member 16$e$ and movable on a circle centered at the optical axis AX (a plane normal to the plane of FIG. 3). By such an arrangement, the position of the secondary light source image is movable to any desired position in the pupil plane 15 of the illumination optical system. The number of exit areas 7$a$, 7$b$, 7$c$ and 7$d$ is not limited to four but an appropriate number of exit areas may be used in accordance with the type of patterns of the reticle to be used.

In the projection type light exposure apparatus to be used in the present invention, it is desirable that the aperture number of the light beam or the light beams for illuminating the reticle is $0.1 < \sigma < 0.3$ where $\sigma$ is the $\sigma$ value in the illumination system. If the $\sigma$ value is too small, the fidelity of the image is lowered by the proximity effect, and if the $\sigma$ value is too large, the interference of the light between the circuit pattern and the auxiliary pattern is weakened and the effect of the present invention is diminished. In the apparatus shown in FIG. 1, the diameters of the optical fiber exit areas 7a and 7b are selected to meet the condition of $0.1 < \sigma < 0.3$. The $\sigma$ value may be adjusted by providing a variable aperture in the illumination optical system. The aperture number of the projection optical system may also be varied in accordance with the line width and the directivity of the pattern.

In the above embodiments, the projection type light exposure apparatus to be used concentrates the light intensity distribution of the illumination light beam at the local area centered at the position eccentric from the optical axis in the pupil plane of the illumination optical system. Alternatively, a light exposure apparatus which has a ring-shape light intensity distribution on the pupil plane (or the Fourier transfrom plane in the illumination optical system) may be used. In this case, the outer diameter of the ring-shape light intensity distribution may be 0.6–0.8 in $\sigma$ value, and the inner diameter may be 0.3–0.6 in $\sigma$ value. The means for forming the local area may be the optical fiber or the light shielding plate having the aperture in accordance with the shape of the local area. An optical system having an optical integrator such as an flyeye lens may be arranged in the exit plane of the optical fiber shown in FIG. 1, or light path shift means may be used in place of the optical fiber to irradiate the shifted light beam to the optical system including the optical integrator. The exit plane of the optical system is substantially in alignment with the pupil plane of the illumination optical system. In this case, mirrors 21 and 22 may be inserted in the illumination light path so that the exit planes of the optical integrators may be arranged face to face (the exit planes are not in one plane).

In the pattern used in the above embodiments, the light shielding area (hatched area) is made of a light shielding member such as chromium, although it may be formed by a single-layer phase shifter. For example, it may be a phase shifter for changing the phase of the transmitted light by $\pi$, having deposit areas of the phase shifter arranged in matrix having a pitch which is larger than the resolution limit of the projection optical system and which prevents the diffracted lights other than the 0-order diffracted light generated at the edge of the phase shifter from being transmitted through the projection optical system. In the light shielding area thus constructed, the lights transmitted through the deposit areas and the non-deposit areas of the phase shifter are cancelled each other because of the phase difference of $\pi$ therebetween, and a dark area is created on the wafer. Namely, the light shielding effect is attained on the wafer without imparting the light shielding property on the reticle.

What is claimed is:

1. A projection type light exposure apparatus comprising:
   a mask having a fine pattern and at least one auxiliary pattern spaced from said fine pattern by a predetermined distance along an edge of said fine pattern;
   a projection optical system for projecting said fine pattern on said mask onto a photosensitive substrate; and
   an illumination optical system for supplying an illumination light to said mask;
   said illumination light being irradiated from at least one local area centered at a position eccentric from an optical axis of said illumination optical system in or a vicinity of a Fourier transform plane of said mask in said illumination optical system.

2. A projection type light exposure apparatus according to claim 1 wherein said auxiliary pattern is linear and a line width of said auxiliary pattern is equal to or smaller than a resolution limit of said projection optical system, and wherein said predetermined distance is in the order of the resolution limit of said projection optical system.

3. A projection type light exposure apparatus according to claim 1 wherein at least one pair of said local areas are arranged substantially symmetrically with respect to the optical axis of said illumination optical system.

4. A projection type light exposure apparatus according to claim 1 wherein the dimension of said local area is selected to meet a relation of $0.1 < \sigma < 0.3$ where $\sigma$ is a quotient of an aperture number of the illumination light supplied to said mask divided by an aperture number of said projection optical system facing said mask.

5. A projection type light exposure apparatus according to claim 1 wherein said illumination optical system includes an optical fiber having an exit plane arranged in said local area.

6. A projection type light exposure apparatus according to claim 1 wherein said illumination optical system includes a light shielding member having an aperture arranged in said local area.

7. A projection type light exposure apparatus according to claim 1 wherein said illumination optical system includes a flyeye lens having an exit plane arranged in said local area.

8. A projection type light exposure apparatus according to claim 1 further comprising means for moving said local area in or the vicinity of said Fourier transform plane.

9. A projection type light exposure apparatus according to claim 1 further comprising means for moving said local area radially around said optical axis.

10. A projection type light exposure apparatus comprising:
    a mask having a fine pattern and at least one auxiliary pattern spaced from said fine pattern by a predetermined distance along an edge of said fine pattern;
    a projection optical system for projecting said fine pattern on said mask onto a photosensitive substrate;
    an illumination optical system for supplying an illumination light to said mask;
    said illumination light being irradiated from at least one local area centered at a position eccentric from an optical axis of said illumination optical system in or a vicinity of a Fourier transform plane of said mask in said illumination optical system; and
    drive means for relatively moving said photosensitive substrate and the focal plane of said projection optical system along the optical axis of said projection optical system during the projection of said fine pattern to said photosensitive substrate.

11. A projection type light exposure apparatus according to claim 10 wherein said auxiliary pattern is linear, and said predetermined distance and a line width of said auxiliary pattern are equal to or smaller than a line width of said fine pattern.

12. A projection type light exposure apparatus comprising:
    a mask having a fine pattern and at least one auxiliary pattern spaced from said fine pattern by a predetermined distance along an edge of said fine pattern;

a projection optical system for projection said fine pattern on said mask onto a photosensitive substrate; and an illumination optical system for supplying an illumination light to said mask;

said auxiliary pattern being linear, and a line width of said auxiliary pattern being equal to or smaller than a resolution limit of said projection optical system;

said illumination optical system irradiating said illumination light to said mask in at least one predetermined direction inclined to said mask with a predetermined angle of incidence.

13. A projection type light exposure apparatus according to claim 12 said predetermined distance is in the order of the resolution limit of said projection optical system.

14. A projection type light exposure apparatus according to claim 12 wherein said predetermined angle of incidence $\theta$ is given by $\sin \theta = \lambda/d$, where d is a distance between the auxiliary patterns along one pattern element of said fine pattern and $\lambda$ is a wavelength of said illumination light.

15. A projection type light exposure apparatus comprising:

a mask having a fine pattern and at least one auxiliary pattern spaced from said fine pattern by a predetermined distance along an edge of said fine pattern;

a projection optical system for projecting said fine pattern on said mask onto a photosensitive substrate;

an illumination optical system for supplying an illumination light to said mask;

said illumination optical system irradiating said illumination light to said mask in at least one predetermined direction with at least one predetermined angle of incidence; and drive means for relatively moving said photosensitive substrate and the focal plane of said projection optical system along the optical axis of said projection optical system during the projection of said fine pattern to said photosensitive substrate.

16. A projection type light exposure apparatus according to claim 15 wherein said auxiliary pattern is linear, and said predetermined distance and a line width of said auxiliary pattern are equal to or smaller than a line width of said fine pattern.

17. A light exposure method comprising the steps of:

forming a set of fine patterns on a mask;

forming at least one auxiliary pattern along an edge of at least one of said set of fine patterns with a predetermined distance therefrom; and irradiating an illumination light beam to said mask through an illumination optical system, which the illumination light beam is transmitted through at least one local area centered at a position eccentric from an optical axis of said illumination optical system in or a vicinity of a Fourier transform plane of said mask in said illumination optical system.

18. A light exposure method according to claim 17 further comprising the step of providing a projection optical system for projecting said set of fine patterns onto a photosensitive substrate, wherein said auxiliary pattern is linear and a line width of said auxiliary pattern is equal to or smaller than a resolution limit of said projection optical system, and wherein said predetermined distance is in the order of the resolution limit of said projection optical system.

19. A light exposure method according to claim 17 wherein at least one pair of said local areas are arranged substantially symmetrically with respect to the optical axis of said illumination optical system.

20. A light exposure method according to claim 17 further comprising the step of providing a projection optical system for projecting said set of fine patterns onto a photosensitive substrate, wherein the dimension of said local area is selected to meet a relation of $0.1 < \sigma < 0.3$ where $\sigma$ is a quotient of an aperture number of the illumination light supplied to said mask divided by an aperture number of said projection optical system facing said mask.

21. A light exposure method according to claim 17 wherein the position of said local area is variable in or a vicinity of said Fourier transform plane.

22. A light exposure method comprising the steps of:

forming a set of fine patterns on a mask;

forming at least one auxiliary pattern along an edge of at least one of said set of fine patterns with a predetermined distance therefrom;

irradiating an illumination light beam to said mask through an illumination optical system, which the illumination light beam is transmitted through at least one local area centered at a position eccentric from an optical axis of said illumination optical system in or a vicinity of a Fourier transform plane of said mask in said illumination optical system, and relatively moving said mask and said photosensitive substrate along the optical axis of said projection optical system when the image of the set of fine patterns on said mask is projected onto said photosensitive substrate through said projection optical system.

23. A light exposure method according to claim 22 wherein said auxiliary pattern is linear, and said predetermined distance and a line width of said auxiliary pattern are equal to or smaller than a line width of said fine pattern.

24. A projection type light exposure apparatus according to claim 1, wherein said mask has an additional auxiliary pattern spaced from said fine pattern by a predetermined distance along another edge of said fine pattern, and wherein the distance between the center of said local area and said optical axis of said illumination optical system is determined in accordance with the distance between the centers of said two auxiliary patterns.

25. A projection type light exposure apparatus according to claim 24, wherein said local area is spaced from a line which is parallel to a longitudinal direction of said fine pattern and passes through said optical axis by $f \cdot \lambda/d$, where d is a distance between the centers of said two auxiliary patterns, $\lambda$ is a wavelength of the illumination light and f is a focal length of the optical system between said mask and said Fourier plane.

26. A projection type light exposure apparatus comprising:

a mask having a fine pattern and at least one auxiliary pattern spaced from said fine pattern by a predetermined distance along an edge of said fine pattern;

a projection optical system for projecting said fine pattern on said mask onto a photosensitive substrate; and an illumination optical system for supplying an illumination light to said mask;

said illumination optical system irradiating said illumination light to said mask in at least one predetermined direction with at least one predetermined angle of incidence;

wherein said mask has an additional auxiliary pattern spaced from said fine pattern by a predetermined distance along another edge of said fine pattern, and wherein the distance between the center of said local area and said optical axis of said illumination optical system is determined in accordance with the distance between the centers of said two auxiliary patterns.

27. A projection type light exposure apparatus according to claim 26, wherein said predetermined angle of incidence $\theta$ is given by $\sin\theta = \lambda/d$, where d is a distance between the centers of said two auxiliary patterns and $\lambda$ is a wavelength of said illumination light.

28. A projection type light exposure apparatus comprising:
a mask having a fine pattern and at least one pair of auxiliary patterns spaced from said fine pattern by a predetermined distance along each edge of said fine pattern;
a projection optical system for projecting said fine pattern on said mask onto a photosensitive substrate;
an illumination optical system for supplying an illumination light to said mask;
said illumination light being irradiated from four local areas centered at positions eccentric from an optical axis of said illumination optical system on or in a vicinity of a Fourier transform plane of said mask in said illumination optical system.

29. A projection type light exposure apparatus according to claim 28, wherein said four local areas are arranged substantially symmetrically with respect to a first line which is parallel to a longitudinal direction of said fine pattern and passes through the optical axis of said illumination optical system and with respect to a second line which is orthogonal to said first line and passes through said optical axis.

30. A projection type light exposure apparatus according to claim 28, wherein the center of each of said four local areas is spaced from said first line and said second line by $f \cdot \lambda/d$, where d is a distance between the centers of said two auxiliary patterns, $\lambda$ is a wavelength of the illumination light and f is a focal length of the optical system between said mask and said Fourier plane.

31. A projection type light exposure apparatus comprising:
a mask having a fine pattern and at least one pair of auxiliary patterns spaced from said fine pattern by a predetermined distance along each edge of said fine pattern;
a projection optical system for projecting said fine pattern on said mask onto a photosensitive substrate; and
an illumination optical system for supplying an illumination light to said mask;
said illumination light being irradiated from a ring-shaped area on a Fourier transform plane of said mask in said illumination optical system;
said ring-shaped area having an outer diameter and an inner diameter which are determined in accordance with said predetermined distance.

32. A projection type light exposure apparatus according to claim 31, wherein said auxiliary pattern is linear and a line width of said auxiliary pattern is equal to or smaller than a resolution limit of said projection optical system, and wherein said predetermined distance is in the order of the resolution limit of said projection optical system.

33. A projection type light exposure apparatus according to claim 31, wherein said outer diameter is determined to meet a relation of $0.6 < \sigma < 0.8$ and said inner diameter is determined to meet a relation of $0.3 < \sigma < 0.6$, where $\sigma$ is a quotient of an aperture number of the illumination light supplied to said mask divided by an aperture number of said projection optical system facing said mask.

34. A projection type light exposure apparatus according to claim 31, further comprising:
drive means for relatively moving said photosensitive substrate and the focal plane of said projection optical system along the optical axis of said projection optical system during the projection of said fine pattern to said photosensitive substrate.

35. A light exposure method comprising the steps of:
providing a mask having a fine pattern and at least one auxiliary pattern spaced from said fine pattern by a predetermined distance along an edge of said fine pattern;
providing a projection optical system for projecting said fine pattern on said mask onto a photosensitive substrate;
said auxiliary pattern being linear, and a line width of said auxiliary pattern being equal to or smaller than a resolution limit of said projection optical system;
providing an illumination optical system for supplying an illumination light to said mask;
said illumination optical system irradiating said illumination light to said mask in at least one predetermined direction inclined to said mask with a predetermined angle of incidence.

36. A light exposure method according to claim 35, wherein said predetermined distance is in the order of the resolution limit of said projection optical system.

37. A light exposure method according to claim 35, wherein said predetermined angle of incidence $\theta$ is given by $\sin\theta = \lambda/d$, where d is a distance between the centers of two auxiliary patterns and $\lambda$ is a wavelength of said illumination light.

38. A light exposure method comprising the steps of:
providing a mask having a fine pattern and at least one auxiliary pattern spaced from said fine pattern by a predetermined distance along an edge of said fine pattern;
providing a projection optical system for projecting said fine pattern on said mask onto a photosensitive substrate;
providing an illumination optical system for supplying an illumination light to said mask;
said illumination optical system irradiating said illumination light to said mask in at least one predetermined direction with at least one predetermined angle of incidence; and
relatively moving said photosensitive substrate and the focal plane of said projection optical system along the optical axis of said projection optical system during the projection of said fine pattern to said photosensitive substrate.

39. A light exposure method according to claim 38, wherein said auxiliary pattern is linear, and said predetermined distance and a line width of said auxiliary pattern are equal to or smaller than a line width of said fine pattern.

40. A light exposure method comprising the steps of:

providing a mask having a fine pattern and at least one auxiliary pattern spaced from said fine pattern by a predetermined distance along an edge of said fine pattern;

providing a projection optical system for projecting said fine pattern on said mask onto a photosensitive substrate;

providing an illumination optical system for supplying an illumination light to said mask;

said illumination light being irradiated from four local areas centered at positions eccentric from an optical axis of said illumination optical system on or in a vicinity of a Fourier transform plane of said mask in said illumination optical system.

41. A light exposure method according to claim 40, wherein said four local areas are arranged substantially symmetrically with respect to a first line which is parallel to a longitudinal direction of said fine pattern and passes through the optical axis of said illumination optical system and with respect to a second line which is orthogonal to said first line and passes through said optical axis.

42. A light exposure method according to claim 40, wherein the center of each of said four local areas is spaced from said first line and said second line by $f\cdot\lambda/d$, where d is a distance between the centers of said two auxiliary patterns, $\lambda$ is a wavelength of the illumination light and f is a focal length of the optical system between said mask and said Fourier plane.

43. A light exposure method comprising the steps of:
providing a mask having a fine pattern and at least one pair of auxiliary patterns spaced from said fine pattern by a predetermined distance along each edge of said fine pattern;

providing a projection optical system for projecting said fine pattern on said mask onto a photosensitive substrate;

providing an illumination optical system for supplying an illumination light to said mask;

said illumination light being irradiated from a ring-shaped area on a Fourier transform plane of said mask in said illumination optical system;

said ring-shaped area having an outer diameter and an inner diameter which are determined in accordance with said predetermined distance.

44. A light exposure method according to claim 43, wherein said auxiliary pattern is linear and a line width of said auxiliary pattern is equal to or smaller than a resolution limit of said projection optical system, and wherein said predetermined distance is in the order of the resolution limit of said projection optical system.

45. A light exposure method according to claim 43, wherein said outer diameter is determined to meet a relation of $0.6 < \sigma < 0.8$ and said inner diameter is determined to meet a relation of $0.3 < \sigma < 0.6$, where $\sigma$ is a quotient of an aperture number of the illumination light supplied to said mask divided by an aperture number of said projection optical system facing said mask.

46. A light exposure method according to claim 43, further comprising relatively moving said photosensitive substrate and the focal plane of said projection optical system during the projection of said fine pattern to said photosensitive substrate.

* * * * *